United States Patent [19]
Yoshida

[11] Patent Number: 4,600,915
[45] Date of Patent: Jul. 15, 1986

[54] DIGITAL-TO-ANALOG CONVERTER CIRCUIT

[75] Inventor: Masayuki Yoshida, Saitama, Japan

[73] Assignee: Pioneer Electronic Corporation, Tokyo, Japan

[21] Appl. No.: 708,904

[22] Filed: Mar. 6, 1985

[30] Foreign Application Priority Data

Mar. 7, 1984 [JP] Japan .............................. 59-33421[U]

[51] Int. Cl.⁴ .............................................. H03M 1/66
[52] U.S. Cl. ...................... 340/347 DA; 340/347 SH
[58] Field of Search .............. 340/347 DA, 347 AD, 340/347 CC, 347 SH; 364/726, 724, 572

[56] References Cited
U.S. PATENT DOCUMENTS
4,306,222 12/1981 Peek ............................ 340/347 DA Primary Examiner—Charles D. Miller
Attorney, Agent, or Firm—Sughrue, Mion, Zinn, Macpeak & Seas

[57] ABSTRACT

A digital-to-analog converter circuit for converting digitized audio signals to analog form having improved phase characteristics and a reduced noise level while employing a less costly low-pass filter than conventional circuits. A digital-to-analog converter converts an analog signal, which has frequency components within a range lower than a first frequency, to analog form. A sample-and-hold circuit samples and holds the output of the digital-to-analog converter at a second frequency more than twice as high as the first frequency. Frequency components in the output of the sample-and-hold circuit above a third frequency between the first and second frequencies are phase inverted. The output of the sample-and-hold circuit and the output of the inverting circuit are summed and applied to a low-pass filter, the output of which provides the analog output from the circuit.

3 Claims, 10 Drawing Figures

DIGITAL-TO-ANALOG CONVERTER CIRCUIT

BACKGROUND OF THE INVENTION

The present invention relates to a digital-to-analog converter circuit, and more particularly, to a digital-to-analog converter circuit for PCM (Pulse Code Modulation)-related equipment.

FIG. 1 exemplifies a conventional digital-to-analog circuit for use in digital audio disc players. In FIG. 1, the digital signal obtained from the disc is supplied to a digital-to-analog converter 1. The output terminal of the digital-to-analog converter 1 is connected to a sample-and-hold circuit 3 through a buffer 2. The sample-and-hold circuit 3 includes an electronic switch 4 and a capacitor 5. A clock pulse signal from a clock generating circuit 6 is applied to the digital-to-analog converter 1, and the sample-and-hold circuit 3 is connected to a LPF (Low-Pass Filter) 8 through the buffer 7. The output signal of the LPF 8 is the analog output of the digital-to-analog converter circuit.

In the conventional digital-to-analog converter circuit thus constructed, the digital-to-analog converter 1 first converts the applied audio digital signal into an analog signal at a sample rate determined by the applied clock pulse signal. The analog signal is supplied to the sample-and-hold circuit 3 through the buffer 2, and stable portions of the analog signal are sampled and held in response to the clock pulse signal. The frequency $F_1$ of the clock pulse signal is over twice as high as the highest frequency $F_2$, of the audio signal. Consequently, the frequency spectrum of the output of the buffer 7 is, as shown in FIG. 2, composed of a primary signal of the audio signal (lower than $F_2$ in frequency) and harmonics of $\pm F_2$ centered around $F_1$. As shown in FIG. 3, since the cut-off frequency is set at the level of $F_2$ by the LPF 8, the frequency spectrum of the output of the LPF 8 is composed of only the primary signal component of the audio signal, as shown in FIG. 4. In digital audio disc players, the frequency $F_2$ is normally set at approximately 20 KHz.

However, the LPF 8 in the conventional digital-to-analog converter circuit requires steep cut-off characteristics, making the circuit of the LPF 8 costly. Also, the presence of the LPF 8 causes changes to the phase characterisitics within the audio range, reducing the overall sound quality. In addition to the above problems, noise is generated in the LPF, even if a high quality LPF is used, so that the dynamic range of the player may be adversely affected.

SUMMARY OF THE INVENTION

It is therefore an object of the present invention to provide a digital-to-analog converter circuit in which the phase characteristics are less disturbed and the noise level reduced.

A digital-to-analog converter circuit according to the present invention includes a digital-to-analog converter circuit for converting into an analog signal a digitized audio signal within the range of effective signal frequencies lower than a first frequency; sample-and-hold means for sampling and holding the output signal of the digital-to-analog converter circuit at a second frequency which is more than twice as high as the first frequency; means for phase inverting components of frequencies higher than a third frequency between the first and second frequencies; and means for adding the output of the sample-and-hold means to that of the inverting means.

DESCRIPTION OF THE PREFERRED EMBODIMENTS

Referring now to FIGS. 6 through 10, a preferred embodiment of the present invention will be described.

Figure 1:
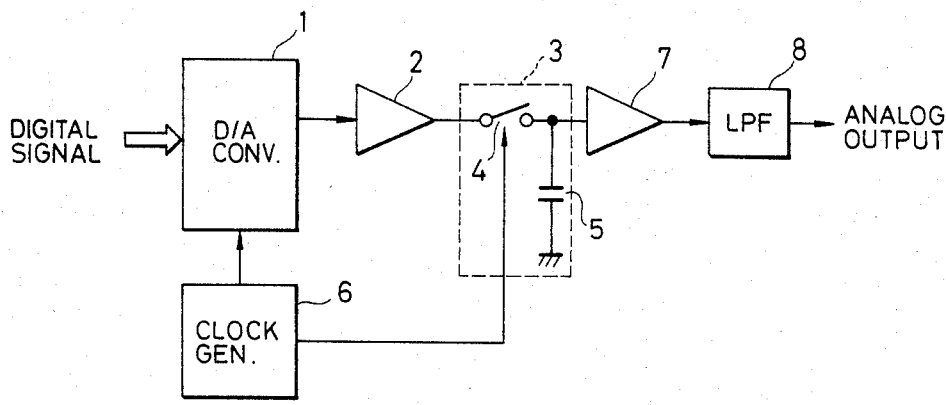
FIG. 1 is a block diagram of a conventional digital-to-analog converter circuit.
Figure 2:
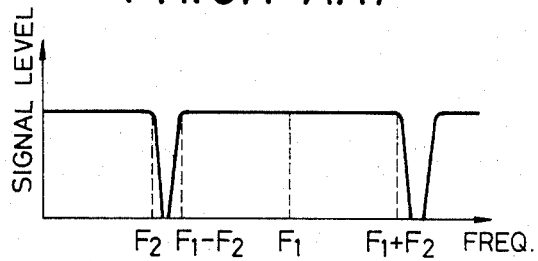
FIGS. 2 and 4 are diagrams illustrating frequency spectra of signals at various points in the circuit of FIG. 1.
Figure 4:
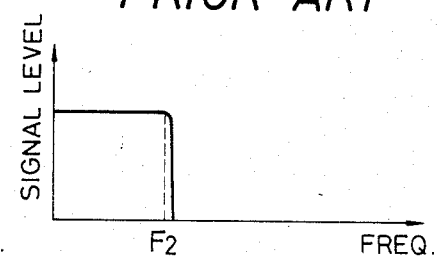
Figure 3:
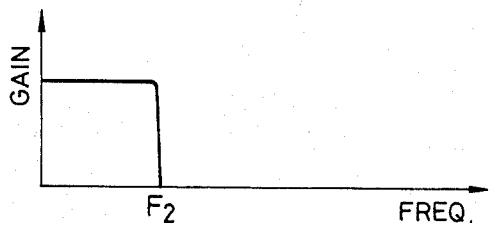
FIG. 3 is a diagram illustrating the frequency characteristics of an LPF in the circuit of FIG. 1.
Figure 5:
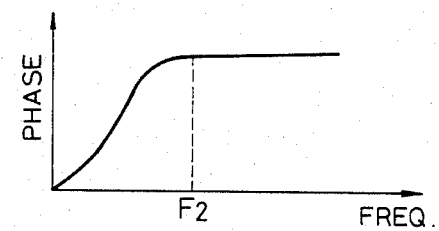
FIG. 5 is a diagram illustrating the phase characteristics of the LPF.
Figure 6:
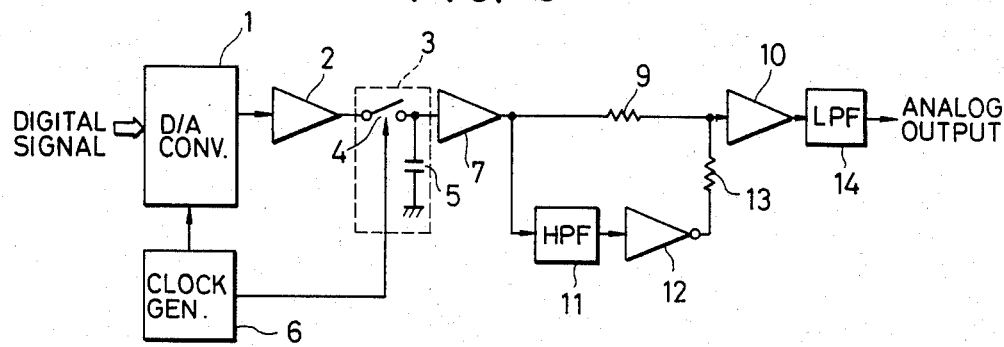
FIG. 6 is a block diagram of a preferred embodiment of a digital-to-analog converter circuit of the present invention.

In FIG. 6, like reference numerals designate like elements in FIG. 1. The frequency $F_3$ of a clock pulse signal supplied from a clock generating circuit 6 to an electronic switch 4 in a sample-and-hold circuit 3 is greater than the frequency $F_1$. The output terminal of a buffer 7 is connected to a summing amplifier 10 through a resistor 9. The output terminal of the buffer 7 is also connected to an inverting amplifier 12 through a HPF (High-Pass Filter) 11. The inverting amplifier 12 subjects the output signal of the HPF 11 to phase-inversion and supplies the resulting signal to the summing amplifier 10. The output terminal of the summing amplifier 10 is connected to an LPF 14, the output of which is an analog value.

Figure 7:
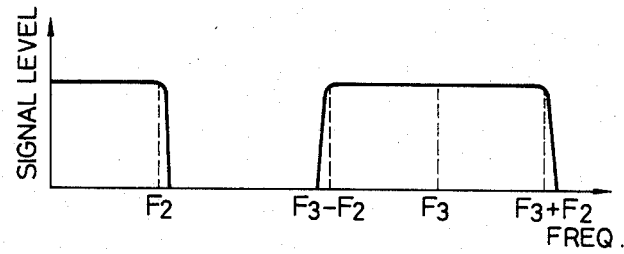
FIGS. 7 and 10 are diagrams illustrating frequency spectra of signals at various points in the circuit of FIG. 6.
Figure 8:
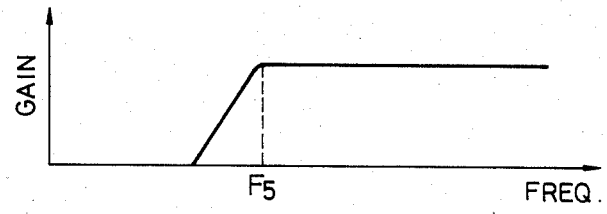
FIG. 8 is a diagram illustrating the frequency characteristics of an HPF in the circuit of FIG. 6.
Figure 9:
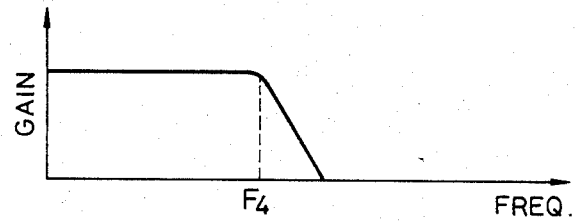
FIG. 9 is a diagram illustrating the frequency characteristics of the LPF in the circuit of FIG. 6.
Figure 10:
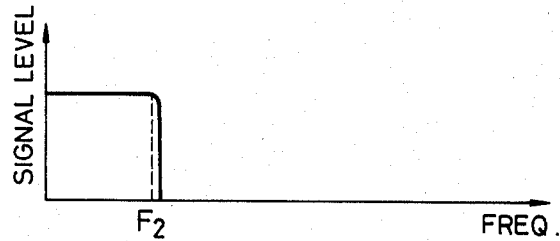

In the digital-to-analog converter circuit thus constructed, according to the present invention, the frequency spectrum of the output of the buffer 7 when the output analog signal of the D/A converter 1 is sampled and held by the sample-and-hold circuit 3 at a frequency $F_3$ is, as shown in FIG. 7, composed of the primary signal component of an audio signal lower than $F_3$ in frequency and a high harmonic at $\pm F_2$ centered around the frequency $F_3$. As shown in FIG. 8, since the cut-off frequency of the HPF 11 is a frequency $F_5$ between the frequencies $F_2$ and $F_3 - F_2$, only the high harmonic component of the output of the buffer 7 is extracted and subjected to phase inversion by the inverting amplifier 12. The phase-inverted output signal and that of the buffer 7 are summed at the input terminal of the adding amplifier 10. That is, because the high harmonic component of the output of the buffer and the output signal of the inverting amplifier 12 are opposite to each other in phase, they cancel upon summation. However, due to the phase characteristics of the HPF 11 and due to the fact that the output of the buffer 7 includes signals of a wide range of frequencies, including 0 to $F_2$, $(F_3-F_2)$ to $(F_3+F_2)$, and $(2F_3-F_2)$ to $(2F_3+F_2)$, it may not be possible to cancel all high-frequency harmonic components even if phase adjustment is made by the inverting amplifier 12. Such a signal is amplified by the amplifier 10 and supplied to the LPF 14. The reason for providing the LPF 14 is to reduce the noise component since some noise component is unavoidably generated in the buffer 7, summing amplifier 10, HPF 11, and inverting amplifier 12. As shown in FIG. 9, the cut-off frequency of the LPF 14 is set at $F_4$, roughly equal to the frequency $F_5$, and, as shown in FIG. 10, the frequency spectrum of the output of the LPF 14 includes only the primary signal component of the audio signal. Thus, an audio signal of good quality is obtained from the output of the LPF 14.

As is evident from the description above, the phase characteristics of the inverting amplifier 12 may be controlled in such a manner as to make possible the cancelation of the spurious output most effectively using the input of the summing amplifier 10, in consideration of the phase characteristics of the HPF 11.

In the digital-to-analog converter circuit according to the present invention, the cut-off frequency of the LPF can be set at a relatively high level since the high harmonic component of the audio signal produced from the sample-and-hold circuit is cut off prior to reaching the LPF, and thus no steep cut-off characteristics for the LPF are required. Accordingly, the phase characteristics of the output signal are made more stable, although a less costly LPF is employed. It also becomes possible to employ a filter such as a Bessel filter whose group delay frequency characteristics are flat within its passband, making available a digital-to-analog converter circuit offering an excellent S/N ratio.

I claim:

1. A digital-to-analog converter circuit comprising a digital-to-analog converter for converting into an analog audio signal within a range of effective signal frequencies lower than a first frequency; sample-and-hold means for sampling and holding an output signal of said digital-to-analog converter at a second frequency more than twice as high as said first frequency; means for phase inverting components in an output of said sample-and-hold means of a frequency higher than a third frequency between said first and second frequencies; and means for summing said output of said sample-and-hold means and an output of said inverting means.

2. The digital-to-analog converter circuit as claimed in claim 1, further comprising a low-pass filter, an output signal of said summing means being supplied to said low-pass filter.

3. The digital-to-analog converter circuit as claimed in claim 1, wherein said phase inverting means comprises a high-pass filter and an inverter connected in series with said high-pass filter.

* * * * *